United States Patent [19]
Allovon et al.

[11] Patent Number: 5,305,343
[45] Date of Patent: Apr. 19, 1994

[54] HIGHLY COUPLED SUPERLATTICE INTEGRATED LASER-MODULATOR COMPONENT

[75] Inventors: Michel Allovon, Fontenay Aux Roses, France; Erwan Bigan, Evanston, Ill.; Jean-Christophe Harmand, Villejuif; Paul Voisin, Paris, both of France

[73] Assignees: France Telecom Etablissement Autonome de Droit Public; Centre National de la Recherche Scientifieque, both of Paris, France

[21] Appl. No.: 941,260

[22] Filed: Sep. 4, 1992

[30] Foreign Application Priority Data

Sep. 6, 1991 [FR] France .............................. 91 11046

[51] Int. Cl.[5] .............................................. H01S 3/19
[52] U.S. Cl. ........................................ 372/50; 372/96; 372/45; 372/20
[58] Field of Search .................. 372/50, 96, 45, 20

[56] References Cited

U.S. PATENT DOCUMENTS 4,101,845  7/1978  Russer ................................. 372/96
4,905,253  2/1990  Chraplyvy et al. ................... 372/96

FOREIGN PATENT DOCUMENTS 0187662  7/1986  European Pat. Off. .
0436413  7/1991  European Pat. Off. .
2607628  6/1988  France .

OTHER PUBLICATIONS

Shams et al., "Monolithic Integration of GaAs-(GaAl-)As Light modulators and distributed-Bragg-reflector lasers", Appl. Phys. Lett. 32(5), Mar. 1978, pp. 314-315.
Patent Abstracts of Japan, vol. 9, No. 19(E-292 [1742], Jan. 25, 1985, & JP-A-59 165 480, Sep. 18, 1984, K. Kasahara, "Semiconductor Light Emitting Element".
Applied Physics Letters, vol. 48, No. 1, Jan. 6, 1986, pp. 1–3, S. Tarucha et al., "Monolithic Integration of A Laser Diode and an Optical Waveguide Modulator Having A GaAs/A1GaAs Quantum Well Double Heterostructure".

*Primary Examiner*—Georgia Y. Epps
*Attorney, Agent, or Firm*—Oblon, Spivak, McClelland, Maier & Neustadt

[57] ABSTRACT

An integrated monolithic electrooptical component having an electrooptical modulator and a semiconductor laser on the same substrate. The modulator and laser are formed from a stack of semiconductor layers. The modulator includes one layer that is absorbent and the laser includes one layer that is active. Both absorbent and active layers are constituted by the same epitaxied structure of a highly coupled composition superlattice with alternation of semiconductor layers of different compositions. A forward voltage is applied to the laser layers that causes the active layer of the laser to emit a radiation which then traverses the absorbent layer of the modulator. A reverse voltage is applied to the modulator layers in order to modulate the absorption of the radiation traversing the modulator.

9 Claims, 4 Drawing Sheets

HIGHLY COUPLED SUPERLATTICE INTEGRATED LASER-MODULATOR COMPONENT

DESCRIPTION

1. Technical Field

The present invention relates to a highly coupled superlattice integrated laser-modulator component. It has applications in the field of optical telecommunications, e.g. for long distance, high rate digital links, as well as in the field of electrooptical switching.

The invention makes use of the procedure of intensity modulation of a light beam by electroabsorption. This phenomenon consists of the optical absorption variation of a material under the effect of an electrical field. The latter is e.g. applied by means of a reverse-biased PIN diode, in which the intrinsic region I (not intentionally doped) contains the electroabsorbant material. In accordance with a so-called guided wave mode, the light is injected into the intrinsic region I parallel to the plane of the layers P, I and N.

The present invention also uses the method of integrating a laser and an electrooptical modulator on the same substance.

2. Prior Art

The monolithic integration of a guided wave electro-optical modulator and semiconductor laser is a field which has been intensively researched, particularly for wavelengths close to 1.55 μm. Thus, it is a strategic component for long distance, high rate telecommunications (several Gbit/s), because it combines the simplicity of installation of a direct modulation laser and the advantages of external modulation, namely wide pass band and in particular limited wavelength fluctuation (chirp). Moreover, the integration of these two elements (laser-modulator) makes it possible to considerably reduce the optical losses between the laser and the modulator, compared with hybrid arrangements where the modulator is connected to the outside of the laser.

In order to take full advantage of this good optical coupling, it is preferable to use a distributed feedback or DFB laser or an equivalent thereof, which make it possible to avoid a mirror between the laser and the modulator. Moreover, this arrangement is necessary for the envisaged application type, which requires a longitudinal monomodal operation.

These two elements of a component (laser-modulator) use epitaxied structures similar to the double heterostructure or DM type and in PIN form, which are subject to forward bias in the case of the laser and reverse bias in the case of the modulator. However, it is not generally possible to precisely use the same active layer in both elements for wavelength compatibility reasons. Thus, the hitherto used electrooptical modulators with the FRANZ-KELDYSH effect (cf. the article by Y. NODA, M. SUZUKI, Y. KUSHIRO and S. AKIBA, published in IEEE J. Lightwave Technol., vol. Lt-4, pp. 1445-1453, 1986) or with a quantum confined STARK effect (cf. article by K. WAKITA, I. KOTAKA, O. MITOMI, H. ASAI, Y. KAWAMURA and M. NAGANUMA, published in IEEE, J. Lightwave Technol., vol. LT-8, pp. 1027-1032, 1990) can only operate for wavelengths higher than that of the edge of the active layer absorption bend, because the application of an electric field in the electroabsorbant material produces a shift towards high wavelengths of the absorption front. This means that the application of an electrical field can only increase the absorption of an initially transparent material (using these effects) and consequently at the chosen operating wavelength, the material of the active layer must be sufficiently transparent the absence of an electric field (conductive state of the modulator).

Conversely, in the case of the laser, stimulated emission occurs at an energy level slightly above that of the forbidden band or gap of the active layer, due to the filling of the bands up to the obtaining of an adequate carrier density to ensure that population reversal occurs. The laser wavelength is therefore slightly below that of the gap of the active layer in the absence of the electric field (because a laser operates in forward bias, i.e. without a field applied to the active layer).

In the operation of the laser, it is also necessary to take account of another effect which in certain cases can make it possible to reestablish wavelength compatibility between the laser and the modulator. This is the so-called gap renormalization effect, which leads to a reduction of the effective gap of the active layer of a laser under forward bias and which is linked with the increase in the carrier density. Therefore this effect cancels out the band filling effect, which is also proportional to the injected carrier density, but which has a tendency to reduce the laser emission wavelength, whereas gap renormalization tends to increase it.

In most cases and in particular for materials able to operate at 1.55 μ, the renormalization effect is not sufficient to cancel out the band filling effect. However, the wavelength compatibility between a laser and a STARK effect modulator has been demonstrated in the case of GaAs/GaAlAs quantum well structures operating at 0.8 μm and reference has been made to this effect for explaining this unusual behavior. Such a component has been described by S. TARUCHA and H. OKAMOTO in Appl. Phys. Lett., vol. 48, pp. 1 to 3, 1986.

However, apart from this exceptional case, when it is a question of producing a component operating with a consideration wavelength (about 1.5 μm) on an InP substrate, use is made of different active layers and therefore different gap widths for the laser and the modulator.

The known solutions can be subdivided into two categories, as a function of whether use is made of different epitaxied structures or similar structures, but with localized variations of the gap.

a) Different epitaxied structures for the laser and the modulator

This category is in turn subdivided into two subcategories as a function of whether two or only one epitaxy stages are used.

i) In two epitaxy stages

Those procedures have permitted the integration of DFB lasers (BRAGG distributed network) with conventional FRANZ-KELDYSH effect modulators at the sought wavelength of 1.55 μm. Such a component is e.g. described by M. SUZUKI, Y. NODA, H. TANAKA, S. AKIBA, Y. KUSHIRO and H. ISSHIKI, in IEEE J. Lightwave Technol., vol. LT-5, pp. 1277-1285, 1987 and by H. SODA, M. FURUTSU, K. SATO, N. OKAZAKI, S. YAMAZAKI, H. NISHIMOTO and M. ISHIKAWA, in Electron. Lett., vol. 26. pp. 9-10, 1990.

The characteristic of this procedure is the use of two successive epitaxy stages for the active layers of the laser and the modulator, which makes it possible to separately optimize the active materials of said two elements. For example, for operation at 1.55 μm, if use is made of conventional structures (i.e. non-quantum structures) for the laser and the modulator, use is made of a quaternary semiconductor material having a gap at 1.55 μm for the laser active layer and a quaternary material of gap 1.45 μm for the active layer of a FRANZ-KELDYSH effect modulator.

ii) In a single stage on an etched substrate

This procedure consists of superimposing the structures of the laser and the modulator in a single epitaxy stage on a substrate having etched grooves made beforehand. The depth of the grooves and the thickness of the layers re such that the active layers of the two components are of the same height, which also makes it possible to separately optimize the active layers of the two components, whilst bringing about an end coupling in a single epitaxy stage. The integration of a laser and a guide according to this procedure is described by D. REMIENS, B. ROSE, M. CARRE and V. HORNUNG in J. Appl. Phys., vol. 68, pp. 2450-2453.

b) Localized variation of the gap of the active layers

In the case of a quantum wall active layer, the variation between the laser and modulator operating wavelengths is smaller. Thus, the wavelength of the modulator can be closer to the wavelength of the absorption front, because the latter is more rigid. In addition, the gap of the active layer is not only dependent on the composition of the materials used, but also the thickness of the quantum walls used. Two solutions can then be envisaged.

i) Localized composition or thickness variation during epitaxy It has e.g. been shown that the growth rate in grooves etched in a substrate is higher than on a planar substrate. This effect has been used for integrating lasers (epitaxied on a previously etched substrate zone) with guides (simultaneously epitaxied on an adjacent, planar zone) in the GaAs/GaAlAs system (cf. article by C. J. CHANG-HASNAIN, E. KARON, J. P. HARBISON and L. T. FLOREZ, published in Appl. Phys. Lett., vol. 56, pp. 429-431, 1990). Identical effects for the growth rate have been demonstrated for other systems of materials and in particular with a high wavelength (cf. article by F. S. TURCO, M. C. TAMARGO, D. M. HWANG, R. E. NAHORY, J. WERNER, K. KASH and E. KARON, published in Appl. Phys. Lett., vol. 56, pp 72-74, 1990 and the article by P. DEMEESTER, L. HOYDENS and P. VAN DAELE, published in Appl. Phys. Lett., vol. 57, pp 168-170, 1990). These effects could be used for a laser-modulator integration.

ii) Localized variation of the gap after epitaxy

It is also possible to start with a homogeneous epitaxy and locally modify the gap of the active layer of one of the two elements and this can be carried out in two different ways. Firstly by a partial interdiffusion of wells and barriers. In this case, there is a slight increase in the gap of the active layer of the modulator (blue shift of the wavelength) by bringing about a certain interdiffusion of the constituents of the walls and the barriers. This shift can be localized in the region of the modulator. It can e.g. be obtained by the implantation of impurities followed by an annealing or by the diffusion of impurities at high temperature. It has been found that in GaAs/GaAlAs that a partial mixing of the quantum wells permits wavelength shifts of an adequate nature for an integration (cf. article by R. L. THORTON, W. J. MOSBY and T. L. PAOLI, published in IEEE J. Lightwave Technol., vol. LT-6, pp 786-792, 1988), while still maintaining the existence of the STARK effect quantum confined in the mixed part (cf. the article by H. RIBOT, F. LARUELLE and L. A. COLDREN, published in Appl. Phys. Lett., vol. 55, pp 2526-2528, 1989). It can also be obtained by doping the active layer of the laser. It is also possible to modify the laser gap in the other direction (shift towards high wavelengths, e.g. with a localized doping of the active layer of the laser by zinc diffusion.

All the known procedures suffer from the disadvantage of depending, either on the epitaxy process, or on the family of materials used. Moreover, they all have one or more critical stages, which are difficult to control and which are prejudicial to the performance characteristics of one or other of the elements of the component. Reference will now be made to each of the previously described solutions in order to stress their disadvantages.

a) Different epitaxied structures for the laser and the modulator

These procedures suffer from the disadvantage of being difficult with regards to the epitaxy, repeat of the epitaxy or epitaxy on an etched substrate, as well as with respect to non-planar, epitaxied structures. It is therefore difficult to obtain as good a material quality level as with separate elements. It is also difficult to obtain a good optical coupling between the two active layers, which limits the performance characteristics of the monolithic component obtained.

b) Localized variation of the gap of the active layers i) Localized composition or thickness variation during epitaxy These procedures are very difficult with respect to the epitaxy and the result is difficult to check, whilst there are material quality problems in the areas where the growth rate is deliberately disturbed. For example, the growth speed or rate variations obtained on the etched substrate do not respect the lattice or mesh matching in the case of ternary or quaternary compounds epitaxied on InP.

ii) Localized variation of the gap after epitaxy This procedure involves a supplementary stage, which is not necessarily easily to check, particularly for obtaining a precise, reproducible value for the sought wavelength shift. Moreover, the mixing process can itself deteriorate the quality of the material (e.g. implantation deficiencies), or can introduce an indesirable doping (diffusion of doping impurities). Finally, the interdiffusion of quantum walls and barriers reduces the quantum confined STARK effect and causes a reduction in the performance characteristics of the modulator.

DESCRIPTION OF THE INVENTION

The object of the present invention is therefore to obviate the above disadvantages. To this end, it proposes the use of the same epitaxied structure as the active layer of the laser and as the electroabsorbant layer of the modulator. This structure is a superlattice with a highly coupled composition. The term composition superlattice is understood to mean a structure obtained by layers of different composition as opposed to lattices of layers with the same composition, but alternate dopings.

It is known that a highly coupled superlattice is a quantum structure of a particular type. It is pointed out in this connection that a superlattice or SL of a highly coupled nature is a succession of wells and potential barriers, in which the respective thicknesses of the wells and the barriers are very small, so that the walls are highly coupled to one another as a result of the resonant tunnel effect.

A distinction is made between such a structure and a so-called multiple quantum well structure, which consists of a succession of walls and potential barriers, in which the thickness of the barriers is sufficient to ensure that the wells are not coupled to one another.

A highly coupled superlattice can function as a modulator in two different ways, in two different wavelength ranges, either as a blue shift modulator, as described in FR-A-2 607 628, or as an oblique transition modulator, as described in FR-A-2 655 433. These two operating modes are possible with the component according to the invention.

Two integration types correspond thereto, either the integration of a blue shift-type modulator, which is wavelength compatible with the laser emission of the same coupled superlattice, or the integration of an oblique transition modulator, whose wavelength range is close to the wavelength range of laser operation and for which different simple means can be used in order to attempt to obtain a good wavelength compatibility, essentially by displacing the operating wavelength of the laser.

It should be observed that the superlattice according to the invention is a composition superlattice (i.e. where the layes have different compositions) and not a doping lattice, where the composition of the layers is always the same, but where doping alternates from one layer to the next. A doping lattice structure is e.g. described in Japanese patent application 59-165480 (Patent Abstracts of Japan, vol. 9, No. 19 E-292, 25.1.1985). In this document, the layers all have the same composition, namely $In_{0.53}Ga_{0.47}As$ and are highly doped, alternately P and N.

In such a structure with alternating dopings, it is not possible to speak of "wells" or "barriers" having different gaps, as in a composition superlattice. This type of structure is known under the name NIPI (n-i-p-i), because it requires undoped intrinsic layers (namely the I of the abbreviation NIPI). Such structures can give rise to electroabsorption, but the phenomena involved have nothing to do with the WANNIER-STARK localization used in the present invention.

DETAILED DESCRIPTION OF AN EMBODIMENT

Before describing the structure of a component according to the invention, the principle and properties of a highly coupled superlattice will be given.

Figure 1:
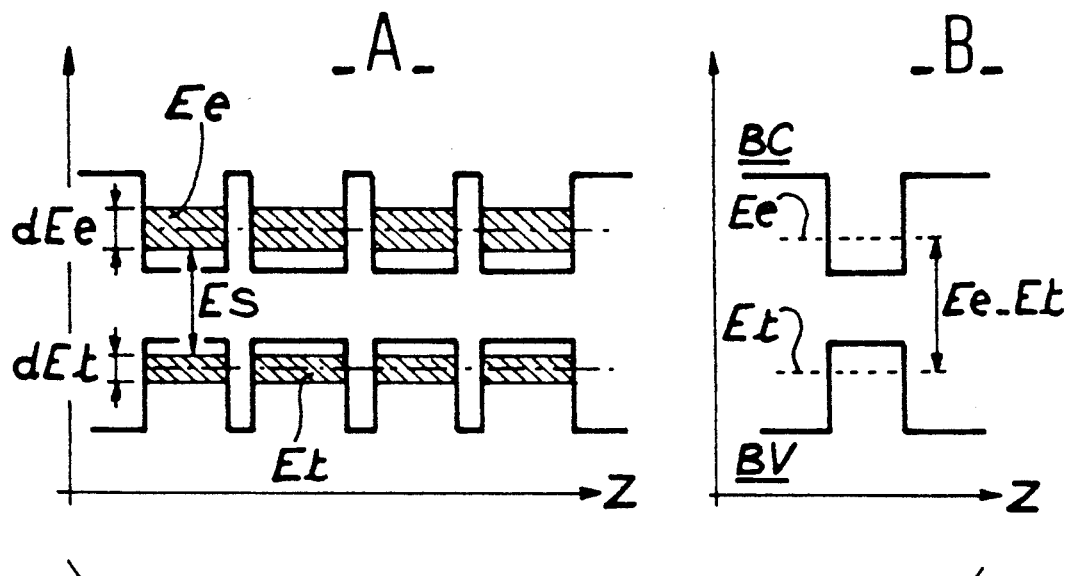
FIG. 1 shows the band structure of a highly coupled superlattice (A) according to the invention and, by comparison, that of an isolated quantum well (B).
Figure 2:
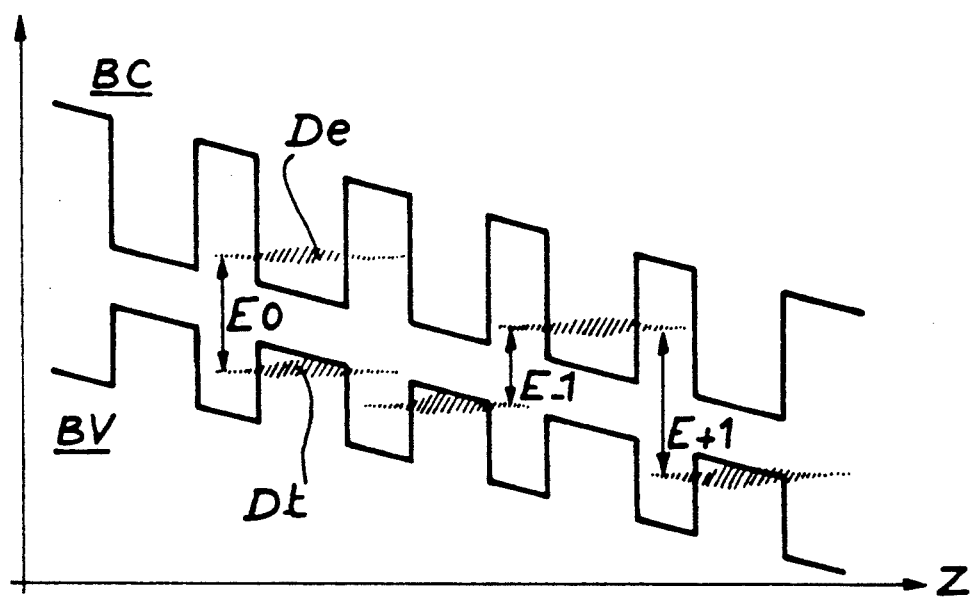
FIG. 2 shows the bend structure of a highly coupled superlattice in the presence of a weak electric field directed in accordance with the growth direction of the superlattice.

In FIGS. 1 and 2, BC designates the conduction band, BV the valence band and the abscissa Z represents the distance perpendicular to the plane of the layers and the ordinate corresponds to the energy.

According to part A of FIG. 1, a highly coupled superlattice is a succession of potential barriers and wells, in which the respective thicknesses of the barriers and wells are very small, so that the walls are highly coupled to one another as a result of the resonant tunnel effect.

This high coupling leads to the creation of energy minibands of widths DEe and dEt respectively around quantified energy levels of the electrons and holes, which are found in a single quantum well (part B). It is pointed out in this connection that a highly coupled superlattice is such that $dEe + dEt \geq 10$ meV.

By applying to the superlattice a weak electric field in the growth direction thereof, the coupling between the walls is broken by the suppression of the resonant tunnel effect. The probability of the tunnel effect decreasing the wave functions De and Dt governing the probability of the presence of electrons and holes tends to essentially localize in the wells in accordance with a so-called WANNIERSTARK localization mechanism.

In absorption terms, this means that the absorption front which would be at an energy Es passes to a higher energy Eo substantially equal to Es increased by the half-sum of (dEe+dEt). Thus, there is a displacement of the front towards high energy levels or, in wavelength terms, a blue shift.

Figure 3:
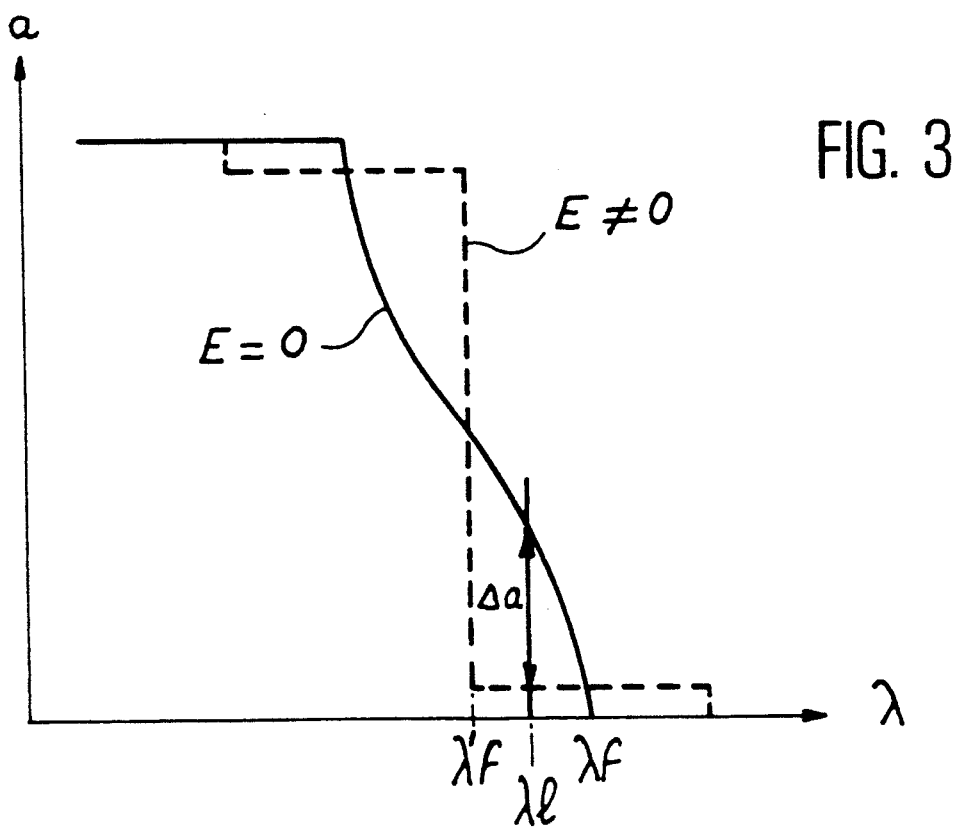
FIG. 3 illustrates the operation of the modulator according to the blue shift embodiment.

FIG. 3 thus shows the theoretical absorption variations (a) as a function of the wavelength λ without an electric field (E=o) (continuous line curve) and with an electric field (E≠O, broken line curve). This absorption front is displaced from the value λf to the value λ'f.

The effect of the blue shift of the absorption threshold in highly coupled superlattices has been described in the article by J. BLEUSE, G. BASTARD and P. VOISIN, published in Phys. Rev. Lett., vol. 60, No. 3, 18.1.1988, pp 220 to 223, as well as in the article by J. BLEUSE, P. VOISIN, M. ALLOVON and M. QUILLEC, published in Applied Physics Letters 53(26), 26.12.1988, pp 2632 to 2634, as well as in French patent application FR-A-2 607 628 referred to hereinbefore.

The energy transition Eo in FIG. 2 corresponds to the same quantum well, but other transitions are possible between adjacent walls. These transitions are said to be oblique (because they involve adjacent walls). These oblique transitions appear either at a lower energy (type E−1). or at a higher energy (Type E+1) compared with the fundamental transition at Eo.

Figure 4:
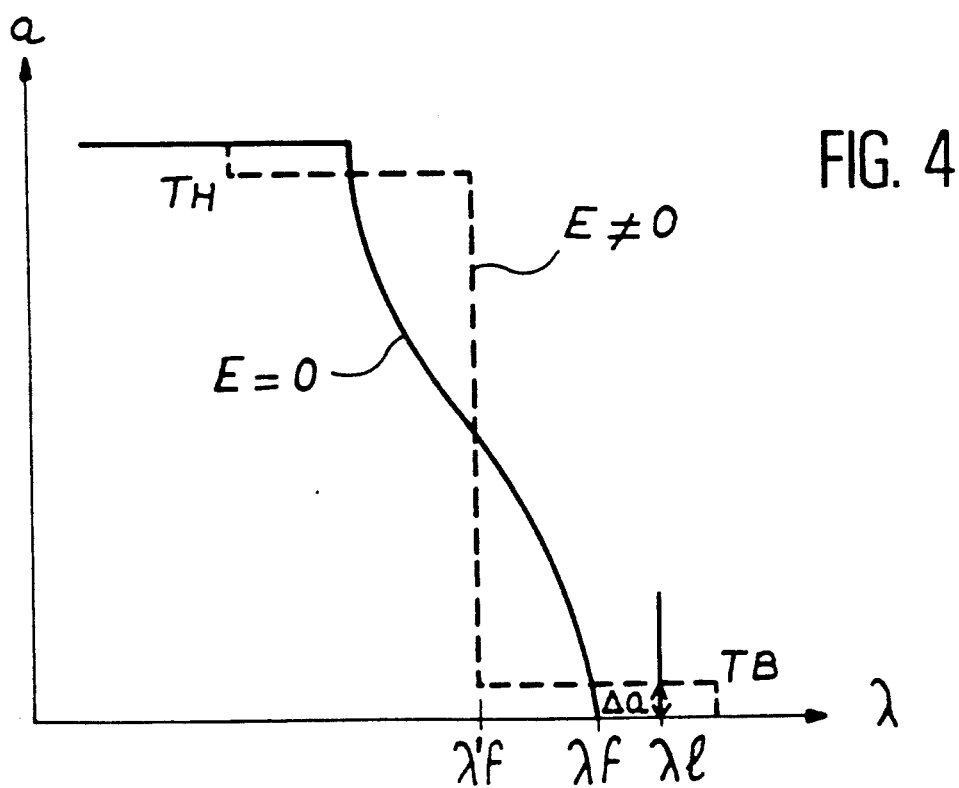
FIG. 4 illustrates the operation of the modulator according to the oblique transition embodiment.

Therefore FIG. 4 shows the theoretical absorption variations (a)as a function of the wavelength λf in the absence of an electric field (E=0) (continuous line curve) and in the presence of an electric field (E≠0) (broken line curve). The staircase-shaped band TB corresponds to a low energy oblique transition and the band TH to a high energy oblique transition. It is the low energy band TB which is used in the second variant of the invention.

The absorption variation (Δa) obtained by the appearance of a low energy oblique transition (FIG. 4) are relatively small (a few hundred cm$^{-1}$). They are significantly smaller than in the case of a blue shift (FIG. 3). Nevertheless, these absorption variations have several advantages:

they appear in the region where the absorption in the conductive state is very small and by using an adequate wavelength, it is consequently possible to have a good extinction level, whilst retaining a low attenuation in the conductive state;

they appear for weak electric fields and therefore for low control voltages (typically 1V applied to a thickness of 0.5 micrometer); they permit an operation on a relatively wide spectral range and consequently lead to a considerable production tolerance on the modulators, as well as an easy optimization thereof.

Highly coupled superlattice modulators operating on the low energy oblique transition are described in French patent application FR-A-2 655 433 referred to hereinafter.

With regards to the laser, which is also constituted by the same highly coupled superlattice, its wavelength $\lambda 1$ is just above the energy of the gap, at a value which will depend on the effective filling of the bands and therefore the injected carriers density. Thus, this gives a certain possible range for the laser wavelength, which is above the effective gap of the superlattice in operation. As a laser operates in forward bias (carrier injection), the gap to be taken into account is that of the superlattice in the absence of an electric field, optionally decreased by the effect of gap renormalization and due to the injected carrier density.

When the modulator operates in the blue shift mode, there is consequently no wavelength compatibility problem between the laser and the modulator, because unlike in the STARK effect described in the prior art, the application of an electric field to the coupled lattice produces a blue shift of the absorption front, whose consequence is to make the superlattice transparent at a wavelength where it would be initially opaque. These negative absorption variations, by the application of an electric field and which are characteristic of the blue shift operation, occur for energy levels just above the gap of the zero field superlattice and therefore precisely in the wavelength range of the laser formed from said same superlattice. The integration of this modulator type with the laser is consequently particularly simple.

FIG. 3 also shows the operating wavelength $\lambda l$ of the assembly, which is located below the wavelength $\lambda f$ of the absorption front in the absence of an electric field and above the wavelength $\lambda'f$ of said front in the presence of an electric field.

However, the performance characteristics of such a modulator are not of an optimum nature, particularly because the transparency in the conductive state is not very good. This represents the interest of integrating an oblique transition modulator, which has much better performance characteristics for the envisaged application (very low control voltages, good modulation contrast). However, in this case, there is a wavelength compatibility problem as in the prior art, but with the considerable advantage associated with the fact that the wavelength variation is now much less than with the prior art structures.

FIG. 4 shows the wavelength of the laser $\lambda l$ in the absorption range linked with the low energy oblique transition (TB), i.e. above the wavelength $\lambda f$ of the absorption front in the absence of an electric field.

All the means described in the prior art can be used either for the blue shift of modulator operation, or for the wavelength shift of the laser towards high wavelengths. It is e.g. possible to use local epitaxy rate variations or the interdiffusion of constituents. It is in particular possible to shift the wavelength of the laser by doping the active layer. In contrast with what has been published in this field (high doping levels obtained a posteriori by implantation or localized diffusion), it is possible to simultaneously n and p dope the active layer of the laser during epitaxy with moderate doping levels. This may be sufficient to widen the laser gain peak. As in a DFB laser, the wavelength is in practice fixed by the spacing of the BRAGG grating and it is possible to slightly shift said wavelength with respect to the maximum of the gain peak (this being already done in direct modulation DFB lasers, but in the other direction), without any significant deterioration to the threshold current.

A description will now be given of an embodiment of an integrated monolithic component according to the invention. To operate at a wavelength close to 1.5 $\mu$m, it is possible to use GaInAs and AsInAs epitaxied to the lattice matching on InP by molecular beam epitaxy (MBE).

The structure of the different layers is given in the following table, the first column giving the thickness of the layers, the second their composition and the third the doping type.

| | | |
|---|---|---|
| 0.1 $\mu$m | GaInAs | p 2.10$^{19}$ |
| 1.8 $\mu$m | AlInAs | p 5.10$^{17}$ |
| 0.0825 $\mu$m | 15 × (2.5 nm GaInAs/3 nm AlInAs) | undoped |
| 0.15 $\mu$m | 20 × (6 nm GaInAs/1.5 nm AlInAs) | undoped |
| 0.0825 $\mu$m | 15 × (2.5 nm GaInAs/3 nm AlInAs) | undoped |
| 0.1 $\mu$m | AlInAs | n 5.10$^{17}$ |
| 80 $\mu$m | InP (substrate) | n$^+$ |

The central superlattice is the electroabsorbant superlattice and the adjacent superlattices only have an optical confinement function and do not influence the emission or electroabsorption properties.

Figure 5:
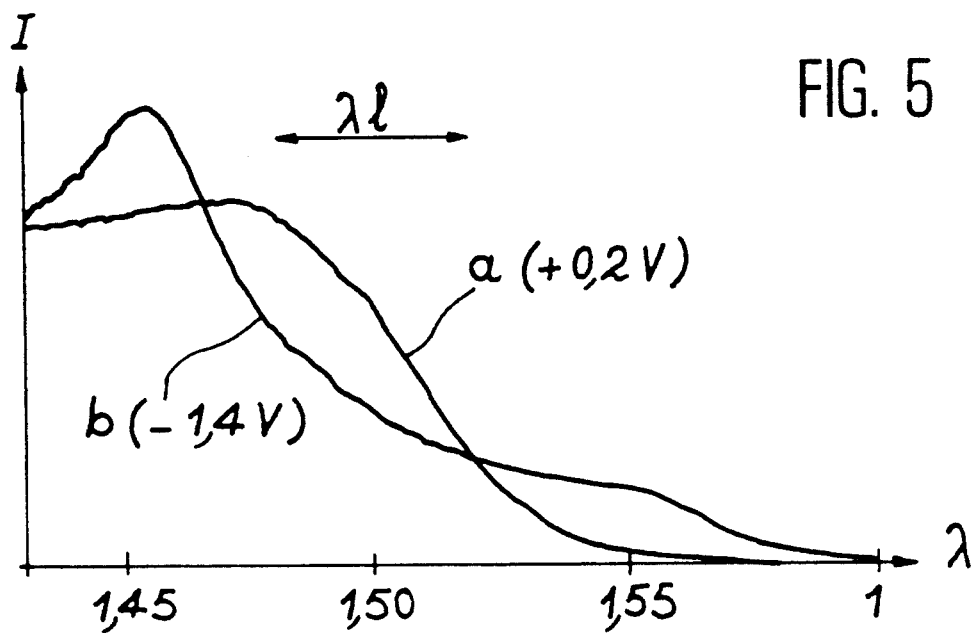
FIG. 5 shows the variation of the photocurrent as a function of the wavelength for two voltages applied to the modulator.

The photocurrent spectrum I($\lambda$) measured in guided waves on said structure (with a very short guide of approximately 5 $\mu$m) is shown in FIG. 5 and represents the absorption in the superlattice. The two curves correspond to applied voltages of 0.2 V (curve a) and $-1.4$ V (curve b). The wavelength range of use for such a structure as a blue shift-type modulator theoretically extends between the two intersection points of the two curves. In practice, it is in the vicinity of 1.5 $\mu$m for said structure.

Figure 6:
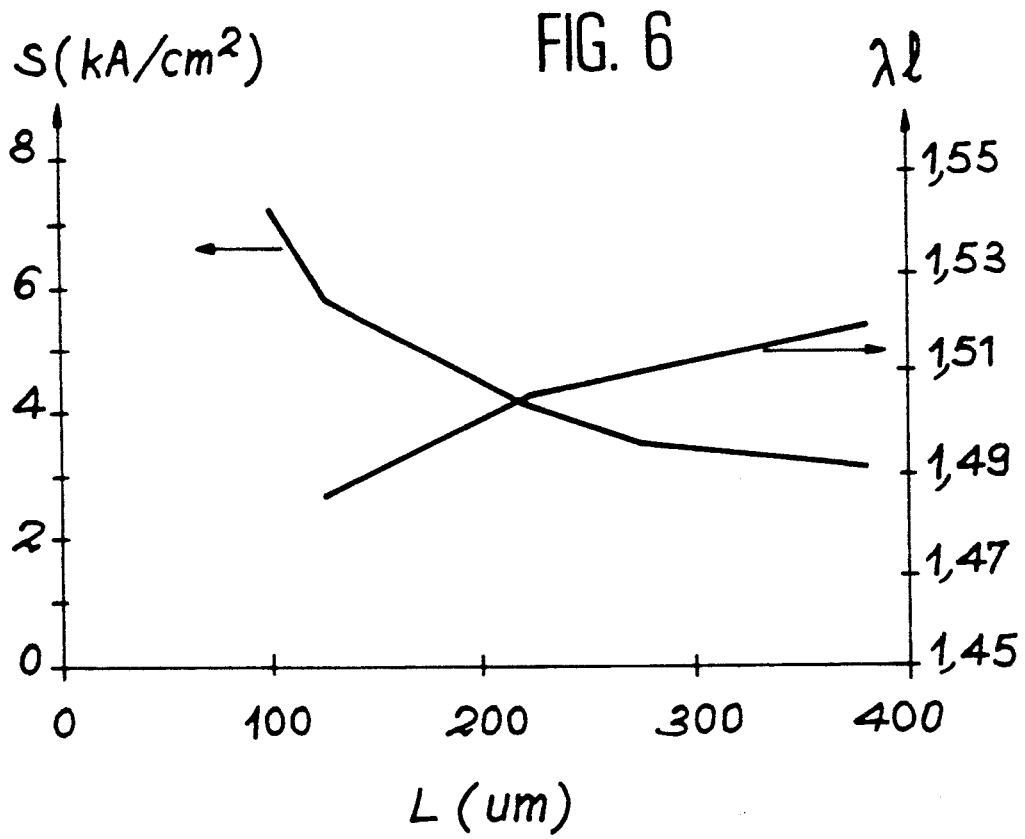
FIG. 6 shows the variations of the laser effect threshold and the laser wavelength as a function of the cavity length.

At this wavelength, a 30 $\mu$m long modulator has an extinction level of approximately 7 dB for an applied voltage variations of 1.6 V, with a residual attenuation in the conductive state of approximately 10 dB. These relatively modest performance characteristics are partly explained by the fact that this structure has not been optimized to operate at this wavelength in the blue shift mode, but instead for the wavelength of 1.55 $\mu$m using the oblique transition mode. When said same structure is forward biased, it gives rise to a stimulated emission with reasonable threshold currents, although not optimized for use as a laser (choice of materials, thickness of the active layer, etc.). The results are given in FIG. 6 as a function of the cavity length. By increasing said length, the carrier density necessary for obtaining the stimulated emission decreases and consequently so does the threshold current density, whilst the laser wavelength $\lambda_1$ increases, which offers a certain wavelength range for laser operation. This range is indicated in FIG. 5 by an arrowed interval. This laser range covers the blue shift range, which justifies the interest of this type of structure for the integration of a laser with a blue shift modulator.

For integration with an oblique transition modulator, it is found that the maximum laser wavelength (1.52 $\mu$m) obtained for a cavity length of only 380 $\mu$m is at the threshold of the operating range of the oblique transition modulator (which starts at the intersection point of the two curves), only 30 nm (approximately 15 meV) from the optimum operating point of said structure as a modulator. Thus, at 1.55 $\mu$m an extinction level of 13 db/100 $\mu$m is obtained for a voltage variation of 1.6 V and a residual absorption of 3 dB/100 $\mu$m only.

The high performance characteristics of this type of modulator and the limited variation in the wavelength compared with the laser range on a non-optimized structure justify the interest of the integration of a laser and a modulator of this type with the aid of the simple means proposed hereinbefore.

Figure 7:
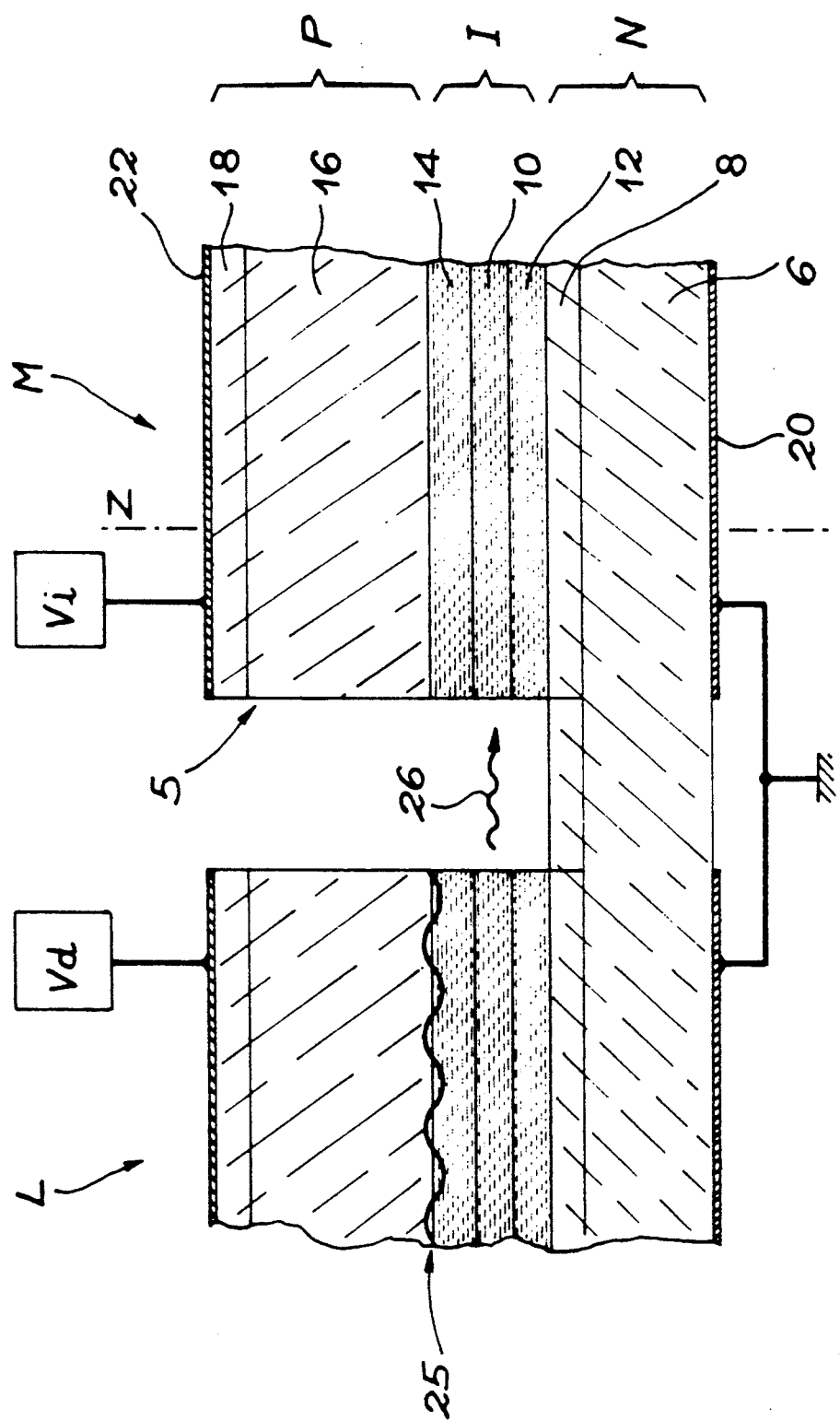
FIG. 7 diagrammatically shows the structure of a component according to the invention.

These considerations with regards to the structure and operation of the component according to the invention having been given, it is now possible to describe a special embodiment in conjunction with FIG. 7. It is possible to see a laser L and a modulator M, which are identical except that the laser is forward biased by a voltage source Vd, whereas the modulator is reverse biased by a voltage source Vi. As the two structures are identical only one of them will be described, namely that of the modulator. As shown, said structure is of the PIN type with an intrinsic region I which, according to the invention, comprises a highly coupled superlattice 10. The region N comprises a n+-InP substrate 6, whose thickness is e.g. 80 $\mu$m and, on said substrate, a 0.1 $\mu$m thick, n-AlInAs buffer layer 8.

The superlattice has the highest optical index and comprises 20 GaInAs layers, which are not intentionally doped and each of which has a thickness of 6 nm, which alternate with 20 layers of AlInAs, which are not intentionally doped and of which each has a thickness of 1.5 nm.

Region I also comprises two identical multilayers 12 and 14 between which is placed the superlattice 10 and whose optical index is below that of the superlattice, but above that of the regions N and P, the two latter indices being identical.

Each of the multilayers 12 and 14 comprises 15 not intentionally doped GaInAs layers, each having a thickness of 2.5 nm, which alternate with 15 not intentionally doped AlInAs layers, with a thickness of 3 nm each. These superlattices only have an optical confinement function and do not constitute a characteristic of the invention.

The region P of the diode comprises a 2 $\mu$m thick, p-AlInAs confinement layer 16. On the layer 16, the region P also comprises a 0.1 $\mu$m thick p+-GaInAs contact layer 18.

FIG. 7 shows the superlattice growth direction Z, which is perpendicular to the plane of the superlattice layers. Metallic layers 20 and 22, e.g. of gold, are respectively deposited on the free face of the substrate 6 and on the free face of the layer 18. The light beam 26 is produced by the laser L and is injected into the modulator M in electric transverse polarization TE. In the laser, a BRAGG grating carriers the reference 25.

The automatic alignment of these two superlattices ipso facto leads to the optical alignment of the active layer of the laser and the absorbent layer of the modulator. The optical coupling between the laser and the modulator is consequently excellent, by the very construction of the component.

We claim:

1. Integrated monolithic electrooptical component comprising on the same substrate an electrooptical modulator (M) formed from a stack of semiconductor layers, whereof one layer (10) is absorbent, a semiconductor laser (L) formed from a stack of semiconductor layers, whereof one (10) is active, means (Vd, 20, 22) for applying to the stack of laser layers a forward voltage crating an electric field perpendicular to the plane of the layers, the laser then emitting by its active layer (10) a radiation (26) traversing the absorbent layer of the modulator in the plane of said layer, means (Vi, 20, 22) for applying to the stack of layers of the modulator (M) a reverse voltage creating an electric field perpendicular to the plane of the layers to modulate the absorption of the radiation traversing the modulator, characterized in that the active layer of the laser (L) and the absorbent layer of the modulator (M) are both constituted by the same epitaxied structure of the highly coupled composition superlattice type (10) with alternation of the semiconductor layers of different compositions.

2. Component according to claim 1, characterized in that the highly coupled superlattice of the modulator has an absorption band with a front located at a certain wavelength($\lambda$f) in the absence of an electric field applied to the modulator superlattice, said front being displaced towards a shorter wavelength in the presence of an applied strong electric field (so-called blue shift mode), the radiation emitted by the laser superlattice having a wavelength ($\lambda$l) slightly below the wavelength ($\lambda$f) of the absorption front in the absence of an electric field, but slightly above the wavelength ($\lambda$'f) of the front in the presence of an electric field, so that the modulator is opaque to the laser radiation in the absence of a voltage applied to the modulator and substantially transparent to said radiation in the presence of a voltage applied thereto.

3. Component according to claim 1, characterized in that the highly coupled superlattice of the modulator has an absorption band with a front located at a certain wavelength ($\lambda$f) in the absence of an applied electric field, an absorption hand (TB) at higher wavelengths appearing when a weak electric field is applied to the modulator superlattice (so-called oblique transition mode), the radiation emitted by the superlattice of the laser (L) having a wavelength ($\lambda$l) slightly above the wavelength ($\lambda$f) of the absorption front in the absence of an electric field and dropping in the absorption bend (TB) appearing in the presence of an electric field, so that the modulator is transparent to the laser radiation in the absence of a voltage applied to the modulator and opaque to said radiation in the presence of a voltage applied thereto.

4. Component according to claim 3, characterized in that the highly coupled superlattices constitute the active layer (10) of the laser (L) and the absorbent layer (10) of the modulator (M) and have been doped simultaneously n and p during epitaxy with a moderate doping level, said n and p doping having the effect of widening the laser gain curve.

5. Component according to any one of the claims 1 to 4, characterized in that the laser is of the distributed feedback (DFB) type which a BRAGG grating (25).

6. Component according to claim 4, characterized in that the BRAGG grating has a spacing which fixes the operating wavelength ($\lambda l$) of the laser to a value just beyond the wavelength corresponding to the maximum of the laser gain peak.

7. Component according to any one of the claims 1 to 4 or 6, characterized in that the superlattices constituting the active layer (10) of the laser (L) and the absorbent layer (10) of the modulator (M) are constituted by a stack of alternately epitaxied layers of ternary or quaternary alloys GaIn(Al)As and (Ga)AlInAs.

8. Component according to any one of the claims 1 to 4 or 6, characterized in that the superlattices constituting the active layer (10) of the laser (L) and the absorbant layer (10) of the modulator (M) are constituted by a stack of alternately epitaxied layers of ternary or quaternary alloys GaInAs(P) and In(GaAs)P.

9. Component according to any one of the claims 1 to 4 or 6, characterized in that the superlattices constituting the active layer (10) of the laser (L) and the absorbent layer (10) of the modulator (M) are constituted by a stack of alternately epitaxied layers of adequate well and barrier materials for a given wavelength range.

* * * * *